United States Patent [19]

Yamaguchi et al.

[11] Patent Number: 5,120,577

[45] Date of Patent: Jun. 9, 1992

[54] METHOD OF PERFORMING METAL COATING ON METALLIZED SURFACES OF ELECTRONIC COMPONENT CHIPS WITH AN ELECTRONIC COMPONENT CHIP HOLDER

[76] Inventors: Masami Yamaguchi; Kenji Minowa, both of c/o Murata Manufacaturing Co., Ltd., 26-10 Tenjin 2-chome, Nagaokakyo-shi, Kyoto, Japan

[21] Appl. No.: 519,243

[22] Filed: Apr. 30, 1990

Related U.S. Application Data

[62] Division of Ser. No. 276,682, Nov. 28, 1988, abandoned.

[30] Foreign Application Priority Data

Nov. 28, 1987 [JP] Japan .................. 62-301063

[51] Int. Cl.⁵ ................................ B05C 3/02
[52] U.S. Cl. ...................... 427/282; 118/500; 118/503; 427/433; 427/436; 427/443.2
[58] Field of Search .............. 269/900, 903, 289 R, 269/296; 228/47, 212; 427/431, 433, 433.2, 436, 282, 284, 96, 98, 102, 123, 79; 118/74, 400, 423, 428, 500, 503

[56] References Cited

U.S. PATENT DOCUMENTS

| | | | |
|---|---|---|---|
| 4,330,594 | 5/1982 | Schneider | 118/503 |
| 4,381,321 | 4/1983 | Braden | 427/79 |
| 4,393,808 | 7/1983 | Braden | 118/503 |
| 4,473,455 | 9/1984 | Dean et al. | 118/503 |
| 4,489,923 | 12/1984 | Barresi et al. | 269/903 |
| 4,526,129 | 7/1985 | Braden | 118/503 |
| 4,580,522 | 4/1986 | Fwioka et al. | 118/500 |
| 4,664,943 | 5/1987 | Nitta et al. | 118/503 |
| 4,669,416 | 6/1987 | Delgado et al. | 269/903 |
| 4,787,550 | 11/1988 | Masuda et al. | 269/903 |
| 4,801,065 | 1/1989 | Colquitt et al. | 269/903 |

FOREIGN PATENT DOCUMENTS

| | | |
|---|---|---|
| 2949196 | 7/1980 | Fed. Rep. of Germany . |
| 3441984 | 5/1985 | Fed. Rep. of Germany . |
| 3532858 | 9/1986 | Fed. Rep. of Germany . |
| 1549862 | 1/1975 | United Kingdom . |
| 2127855A | 9/1983 | United Kingdom . |
| 2151159A | 11/1984 | United Kingdom . |
| 2152854A | 11/1984 | United Kingdom . |
| 2169923A | 8/1985 | United Kingdom . |

OTHER PUBLICATIONS

Thimineur, R. J., "Silicone", Mod. Plastics Encyc. Oct. '74 McGraw-Hill, N.Y., N.Y.
Weast., Handbook of Chem. and Physics, 64th ed., 1983–1984, CRC Press, Boca Raton, Fla. (p. F-127) copy in A.U. 135.

Primary Examiner—Willard E. Hoag

[57] ABSTRACT

An electronic component chip holder employed for coating metallized surfaces on both longitudinal ends of a plurality of electronic component chips with a metal such as solder, while holding the same. The holder comprises a plurality of holding portions for holding the electronic component chips one by one. Each of the holding portions is defined by a through hole, and each of the electronic component chips is inserted in the holding so as to be longitudinally aligned with the axis of the through hole. An elastic member is formed on an inner peripheral surface defining each holding portion, to elastically hold a longitudinal intermediate portion of each electronic component chip. A plurality of electronic component chips thus held by the holder are collectively dipped in a molten bath of a metal such as solder, so that coating films of such a metal are formed on the metallized surfaces.

16 Claims, 5 Drawing Sheets

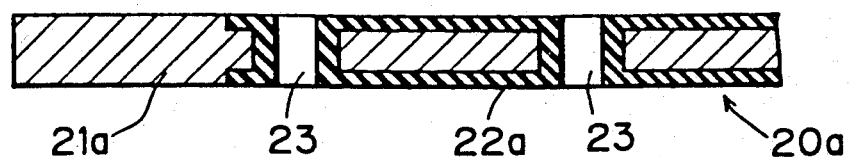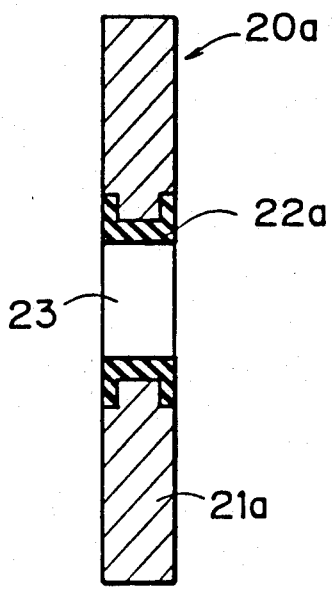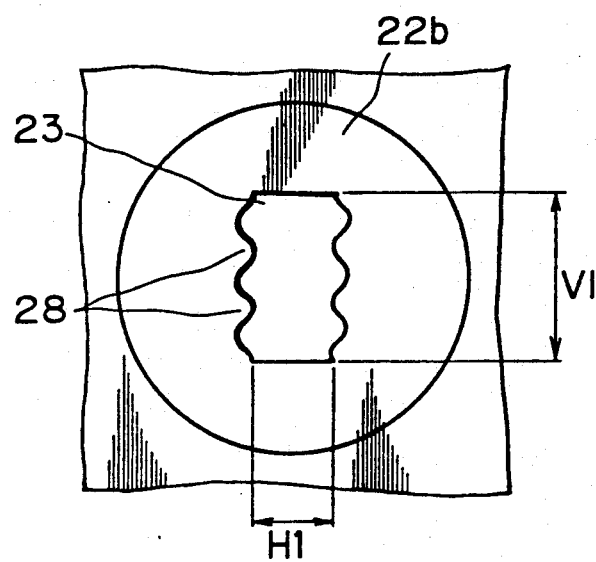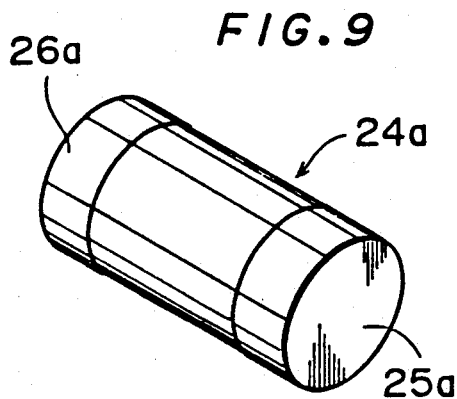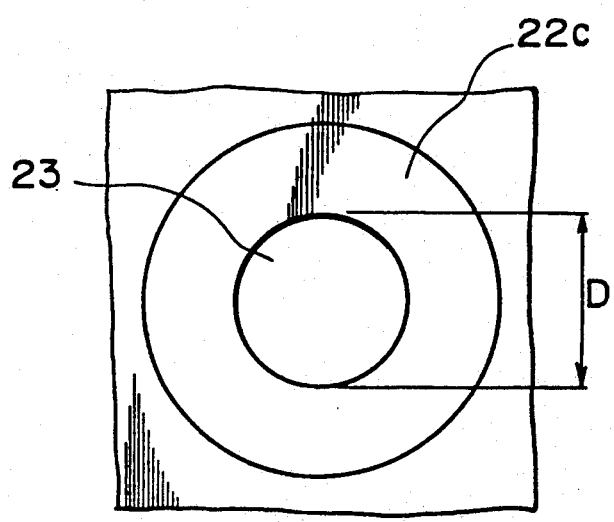

METHOD OF PERFORMING METAL COATING ON METALLIZED SURFACES OF ELECTRONIC COMPONENT CHIPS WITH AN ELECTRONIC COMPONENT CHIP HOLDER

This is a divisional of application Ser. No. 07/276,682, filed on Nov. 28, 1988, now abandoned.

BACKGROUND OF THE INVENTION

1. Field of the Invention

The present invention relates to a technique for efficiently coating a large number of electronic component chips with metal films for providing external terminals, for example, and more particularly, it relates to an electronic component chip holder which can be advantageously employed for holding a plurality of electronic component chips for such an operation. The invention also relates to a method of using such an electronic component chip holder, and more specifically, it relates to a method of performing metal coating on metallized surfaces of electronic component chips.

Throughout the specification, the term "electronic component chips" includes the so-called partially fabricated items to be subjected to soldering for preventing oxidation of metallized surfaces for serving as external terminals, mounting of lead wires and the like, for example, in addition to finished chip-type electronic components to be directly mounted on circuit boards.

2. Description of the Background Art

An electronic component chip serving as a capacitor, a resistor or an inductor, for example, is generally provided with external terminals on both longitudinal ends. In order to form such external terminals, for example, silver paste is generally applied to prescribed positions of the chip body, and is then baked. However, such metallized surfaces containing silver are easily oxidized. Therefore, the silver-metallized surfaces are coated with solder, for example, to prevent oxidation. Such solder coating is also adapted to prevent suffering silver from the so-called solder leaching when the electronic component chip is soldered onto a circuit board by means of the external terminals. In a similar point of view, such solder coating may not be directly applied on the silver-metallized surfaces, but a tin layer may be interposed therebetween.

In order to perform the aforementioned solder coating by a conventional method, basically an electronic component chip already having surfaces metallized with silver or the like is dipped into a molten bath of solder. Thus, films of solder are selectively formed on the metallized surfaces. In mass production, a large number of extremely small-sized electronic component chips must be efficiently processed. Therefore, the electronic component chips are generally handled by means of a holder which can hold a large number of such electronic component chips.

FIG. 10 shows a first example of an electronic component chip holder, which has been employed in the plant of the assignee. This electronic component chip holder 1 is entirely in the form of a plate, which is prepared from a metal of inferior solderability such as stainless steel, for example. A pressure-sensitive adhesive double-coated tape, for example, is adhered onto the upper end surface of the holder 1, thereby to define an adhesive face 2. On the other hand, each of the electronic component chips 3 is provided with metallized surfaces 4 and 5 on both of their respective longitudinal ends. A plurality of such electronic component chips 3 are so adhered onto the adhesive face 2 that the respective metallized surfaces 4 and 5 are separated from the adhesive face 2, to be held by the holder 1.

The plurality of electronic component chips 3 held by the holder 1 as shown in FIG. 10 are dipped in a molten bath of solder (not shown). Thus, both of the metallized surfaces 4 and 5 are brought into contact with the molten bath of solder. Then, the electronic component chips 3, being held by the holder 1, are raised up from the molten bath of solder, to solidify parts of the solder adhered on the metallized surfaces 4 and 5. Thus, the metallized surfaces 4 and 5 are selectively coated with solder.

According to the first example shown in FIG. 10, however, the pressure sensitive adhesive may remain on the surfaces of the electronic component chips 3 when the same are separated from the adhesive face 2 upon completion of the solder coating step. Consequently, two or more electronic component chips 3 may stick to each other, to hinder handling in a later step. Further, since the adhesive forming the adhesive face 2 is not much sufficiently heat resistant, metals employable for coating are restricted so far as the electronic component chips 3 are dipped in the molten bath of a metal.

FIG. 11 shows a second example of an electronic component chip holder, which is to be employed in the plant of the assignee. This electronic component chip holder 6 is entirely in the form of a flat plate, which is provided with holding portions 7 defined by through holes perpendicularly passing through the same. The holding portions 7 are distributed to form rows and columns along the plane of the holder 6. FIG. 12 is an enlarged sectional view showing one of the holding portions 7.

It is understood from FIG. 12 that an elastic member 8 of silicone rubber, for example, is formed on an inner peripheral surface defining the holding portion 7. An electronic component chip 3 is inserted into the holding portion 7 along its longitudinal direction, to be elastically held by the elastic member 7. Then, one metallized surface 4 of the electronic component chip 3 is first exposed from the holder 6.

In order to coat the metallized surfaces 4 and 5 with solder, for example, the holder 6 is turned over from the state shown in FIG. 12 to dip the electronic component chip 3 in a molten bath of solder while holding the same, so as to bring the metallized surface 4 into contact with the molten bath. Thereafter, the electronic component chip 3 is raised up from the molten bath of solder. Thus, the metallized surface 4 is coated with solder. Then, the electronic component chip 3 is moved within the holding portion 7 along its longitudinal direction, so that the other metallized surface 5 is exposed from the holder 6. The electronic component chip 3 is then dipped in the molten bath of solder to bring the metallized surface 5 into contact with the molten metal, and thereafter is raised up from the same. Thus, both of the metallized surfaces 4 and 5 of the electronic component chip 3 are coated with solder.

In the aforementioned second example, however, the metallized surfaces 4 and 5 are separately coated with solder so as to require two soldering steps, which is undesirable in view of productivity.

Further, when the electronic component chip 3 is moved within the holding portion 7 after the metallized surface 4 is coated with solder to expose the other metallized surface 5 as shown in FIG. 13, for example, a solder film 9 formed on the metallized surface 4 may be scraped and stained by the elastic member 8, to deteriorate the appearance of the electronic component chip 3.

Further, since the metallized surface 4 is coated with solder in the formation of the solder film 9 as shown in FIG. 13, the solder film 9 may be remelted by heat upon dipping of the metallized surface 5 in the molten bath of solder.

In addition, air may remain between the lower surface of the holder 6 and the liquid surface of the molten bath of solder when the metallized surface 5 is coated with solder as shown in FIG. 13, for example, whereby an air bubble 10, shown by a broken line, may be formed on the lower surface of the holder 6. Such an air bubble 10 prevents the metallized surface 5 from proper contact with the solder, to cause a defect in the solder film to be formed on the metallized surface 5.

When the electronic component chip 3 is raised up from the molten bath of solder after the metallized surface 5 is brought into contact with the molten bath of solder, a solder drop 11 may be formed as shown by a two-dot chain line in FIG. 13. Such a solder drop 11 arises as the downwardly directed area of the metallized surface 5 is increased when the same is raised up from the molten bath of solder. Thus, upward movement of the electronic component chip 3 in the direction shown in FIG. 13 leads to the largest volume of such a solder drop 11. When the solder drop 11 is solidified in such a state, the appearance of the electronic component chip 3 is deteriorated while the volume of solder used therefor is increased, leading to an undesirable increase in cost. The above description with reference to the metallized surface 5 also applies to the metallized surface 4.

SUMMARY OF THE INVENTION

Accordingly, an object of the present invention is to provide an electronic component chip holder, which can solve the aforementioned problems of the background art.

Another object of the present invention is to provide a method of using the aforementioned electronic component chip holder, i.e., a method of performing metal coating on metallized surfaces of electronic component chips through the use of such a holder.

The present invention provides an electronic component chip holder for holding a plurality of electronic component chips, each of which has dimensions along longitudinal, crosswise and perpendicular directions that are orthogonal to each other. In order to solve the aforementioned technical problems, the present invention has the following structure:

The electronic component chip holder has a perpendicular dimension selected to be smaller than the longitudinal dimension of the electronic component chips, and comprises a plurality of holding portions which are defined by through holes passing through the holder along the perpendicular direction and having sectional dimensions capable of receiving the crosswise and perpendicular dimensions of the electronic component chips for receiving the respective ones of the plurality of electronic component chips one by one along the longitudinal direction.

An elastic member is formed on at least a pair of opposite portions of an inner peripheral surface defining each of the holding portions, for elastically holding a longitudinal intermediate portion of each of the electronic component chips.

The present invention also provides a method of performing metal coating on first and second metallized surfaces of a plurality of electronic component chips having the aforementioned dimensional relation and being provided with the first and second metallized surfaces respectively on their respective longitudinal ends thereof. In order to solve the technical problems, the inventive method comprises: a step of preparing an electronic component chip holder having a perpendicular dimension selected to be smaller than the longitudinal dimension of the electronic component chips and comprising a plurality of holding portions which are defined by through holes passing through the same in the perpendicular direction and having sectional dimensions capable of receiving the crosswise and perpendicular dimensions of the electronic component chips, the through holes being for receiving respective ones of the plurality of electronic component chips one by one along the longitudinal direction, while being provided with an elastic member on at least a pair of opposite portions of an inner peripheral surface defining each of the holding portions for elastically holding a longitudinal intermediate portion of each of the electronic component chips; a step of inserting respective ones of the plurality of electronic component chips into the respective holding portions along the longitudinal direction while elastically holding the same by the elastic members, thereby to hold the plurality of electronic component chips by the electronic component chip holder while exposing both of the first and second metallized surfaces of the electronic component chips; a step of preparing a molten bath of a metal to be adapted to the metal coating; a step of dipping the plurality of electronic component chips in the molten bath of the metal while holding the same by the electronic component chip holder thereby to bring both of the first and second metallized surfaces into contact with the molten bath; and a step of raising up the plurality of electronic component chips from the molten bath while holding the same by the electronic component chip holder, to solidify parts of the metal adhered onto the first and second metallized surfaces.

The electronic component chip holder according to the present invention can hold respective ones of a plurality of electronic component chips while exposing both of their longitudinal ends. Thus, a large number of electronic component chips can be efficiently subjected to operations such as formation of external terminals, metal coating on metallized surfaces and the like, which operations are to be performed on both longitudinal ends of the electronic component chips held by the electronic component chip holder. In other words, desired processing can be performed on both of the longitudinal ends of the electronic component chips without changing the position of the chips in the holder, unlike in the second background apparatus shown in FIGS. 11 to 13, whereby such processing on the longitudinal ends can be efficiently carried out through a single step, while causing no problem such as remelting of solder, for example. Further, no deterioration in appearance of the electronic component chips is caused by, for example, scraping of solder films following movement of the electronic component chips in the holding portions. The electronic component chips are elastically held by the elastic members within the holding portions, whereby no adhesive sticks to the electronic component chips, unlike in the first background apparatus shown in FIG. 10. A material for the elastic members can be generally selected from those materials having higher heat resistance than a pressure sensitive adhesive. Thus, the present invention is also applicable to a metal having a relatively high melting point, even if the electronic component chips must be dipped in a molten bath of such a metal to receive metal coating.

According to the inventive method, on the other hand, the electronic component chip holder holds a plurality of electronic component chips while exposing both of first and second metallized surfaces provided on longitudinal ends of the electronic component chips, which in turn are dipped in a molten bath of a metal. Therefore, both of the first and second metallized surfaces can be simultaneously brought into contact with the molten bath, and hence metal coating can be efficiently performed through a single step, unlike the second background apparatus shown in FIGS. 11 to 13. Consequently, metal coating films provided in the first place will not be stained or remelted. Further, the electronic component chips can be dipped in the molten bath of the metal while substantially vertically directing the plane of the electrónic component chip holder toward the liquid surface of the molten bath. Thus, no air is left between the liquid surface of the molten bath and the electronic component chip holder to cause defects in the metal coating films. In addition, conditions of the electronic component chips can be easily selected to minimize downwardly-directed areas of the metallized surfaces when the same are dipped in the molten bath of the metal, whereby no large drop of a molten metal is formed when the same are raised up from the molten bath of the metal. Thus, thin and uniform metal coating films can be easily formed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is an enlarged sectional view taken along the line V—V in FIG. 4;

FIG. 6 is an enlarged sectional view taken along the line VI—VI in FIG. 4;

FIGS. 7 and 8 are front elevational views corresponding to FIG. 3, for illustrating other embodiments of the present invention respectively;

FIG. 9 is a perspective view showing a cylindrical electronic component chip 24a as another example of an electronic component to which the present invention is applied;

DESCRIPTION OF THE PREFERRED EMBODIMENTS

Figure 1:
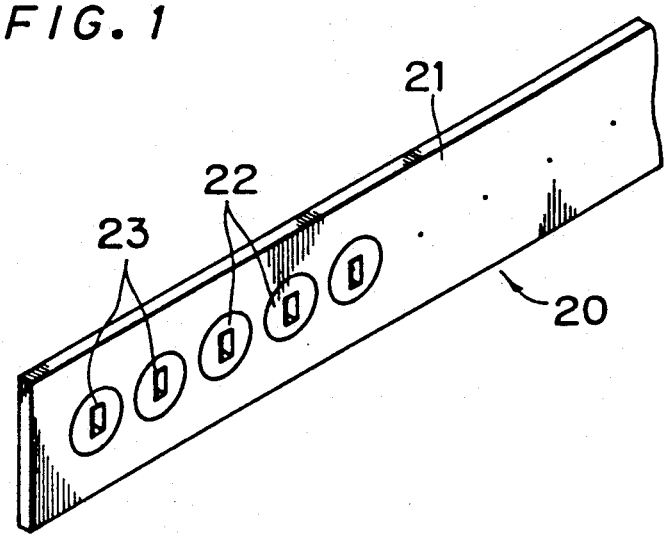
FIG. 1 is a perspective view showing the appearance of an electronic component chip holder 20 according to an embodiment of the present invention.

FIG. 1 is a perspective view showing an electronic component chip holder 20 according to an embodiment of the present invention. The holder is in the form of a plate or a strap as a whole. Such a holder 20 comprises a holder body 21 and elastic members 22. The holder body 21 is formed by, for example, a plate of a metal having inferior solderability such as stainless steel, or that of resin having relatively-high heat resistance. On the other hand, the elastic members 22 are formed of a relatively heat-resistant resin material having appropriate elasticity such as silicone rubber, epoxy resin or fluoro rubber, for example.

Figure 2:
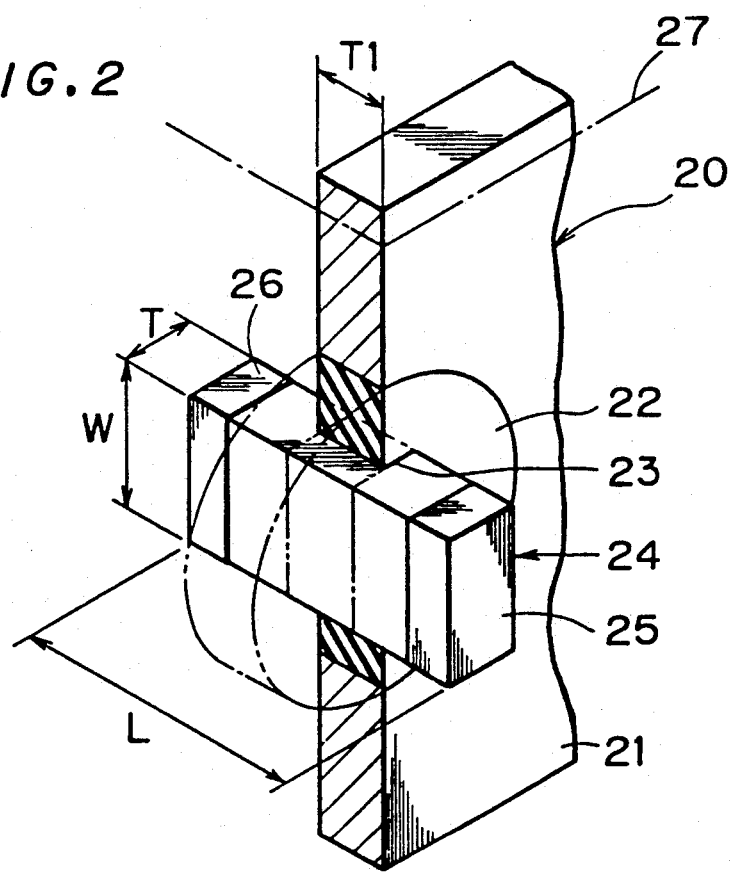
FIG. 2 is a fragmentary enlarged view of the holder 20 shown in FIG. 1, for illustrating a sectional view of a longitudinal portion of a holding portion 23.
Figure 3:
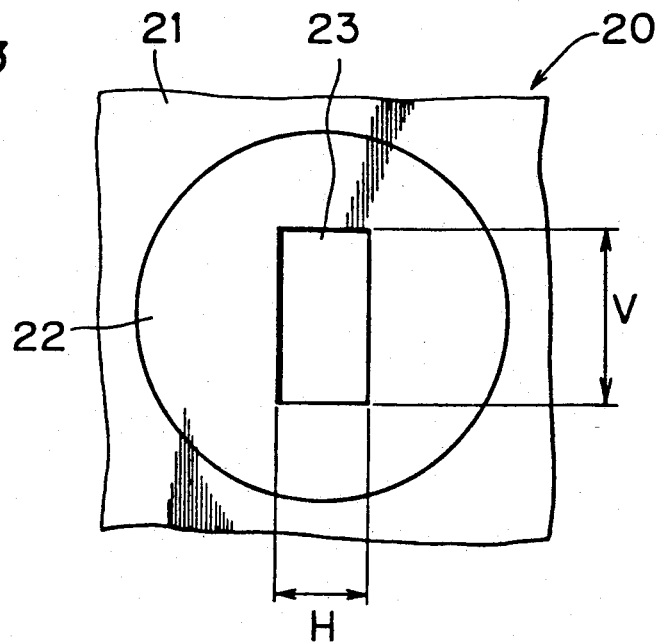
FIG. 3 is an enlarged front elevational view illustrating a part around the holding portion 23 shown in FIG. 1.

The holder 20 is provided with a plurality of holding portions 23, which are defined by through holes perpendicularly passing through the same and distributed along the longitudinal direction thereof. FIG. 2 is an enlarged perspective view sectionally illustrating a longitudinal view of a central part of one of the holding portions 23, and FIG. 3 is an enlarged front elevational view showing a part around one of the holding portions 23.

An inner peripheral surface defining each holding portion 23 is formed by each of the aforementioned elastic members 22. As shown in FIG. 2, the elastic member 22 is adapted to elastically hold an electronic component chip 24. Therefore, it is not necessary to provide the elastic member 22 entirely over the inner peripheral surface defining the holding portion 23 as shown in the figure, but rather, the elastic member only needs to be formed on at least a pair of opposite portions of such an inner peripheral surface.

The electronic component chip 24, being in the form of a rectangular parallelepiped as shown in FIG. 2, for example, has respective dimensions L, W and T along longitudinal, crosswise and perpendicular directions, which are orthogonal to each other. According to this embodiment, the longitudinal dimension L has the longest size and the crosswise dimension W has the second longest size among the dimensions L, W and T. The perpendicular dimension T may be equal to the crosswise dimension W. The electronic component chip 24 is provided on both its longitudinal ends with first and second metallized surfaces 25 and 26 for forming external terminals. The metallized surfaces 25 and 26 may be formed by films obtained by applying silver paste and baking the same, or metal films formed by plating or by another thin film forming technique.

As shown in FIG. 2, a perpendicular dimension T1 of the holder 20 is selected to be smaller than the longitudinal dimension L of each electronic component chip 24. Further, each holding portion 23 has sectional dimensions capable of receiving the crosswise and perpendicular dimensions W and T of each electronic component chip 24, so that a plurality of electronic component chips 24 can be longitudinally inserted one by one into a plurality of holding portions 23. According to this embodiment, however, the inner peripheral surface defining each holding portion 23 is entirely formed by the elastic member 22, which is adapted to elastically hold the electronic component chip 24. In relation to the dimensions of the electronic component chip 24, therefore, the sectional dimensions of the holding portion 23, i.e., vertical and horizontal dimensions V and H shown in FIG. 3 can be selected as follows:

The holding portion 23 may be selected to have a vertical dimension V which is slightly smaller than the crosswise dimension W of the electronic component chip 24 and a horizontal dimension H which is slightly smaller than the chips perpendicular dimension T. Alternatively, either the vertical dimension V or the horizontal dimension H may be selected to be slightly smaller than the crosswise dimension W or the perpendicular dimension T corresponding thereto.

Each electronic component chip 24 is elastically held by the elastic member 22 at its longitudinal intermediate portion. In this state, both of the first and second metallized surfaces 25 and 26 are exposed from the holder 20. The metallized surfaces 25 and 26 are coated with a metal such as solder, for example. In addition to solder, the metal for such coating may be prepared from a metal having a relatively low melting point such as lead, tin or the like, in relation to heat resistance of the elastic member 22.

As schematically shown in FIG. 2, the electronic component chip 24, which is held by the holder 20, is dipped in a molten bath 27 of a metal such as solder. Thus, both the first and second metallized surfaces 25 and 26 are brought into contact with the molten bath 27. Then, the electronic component chip 24 is raised up from the molten bath 27 while being held by the holder 20. In response to this, parts of the metal adhered onto the first and second metallized surfaces 25 and 26 are solidified to define metal films of solder or the like on the metallized surfaces 25 and 26. The outer surface of the electronic component chip 24, which serves as a laminated ceramic capacitor or the like, for example, is formed of ceramic except for the regions provided with the metallized surfaces 25 and 26. Further, the elastic member 22 is formed of resin and the holder body 21 is formed of a metal having inferior solderability or the like. Thus, the aforementioned metal coating films are selectively formed only on the metallized surfaces 25 and 26.

Figure 4:
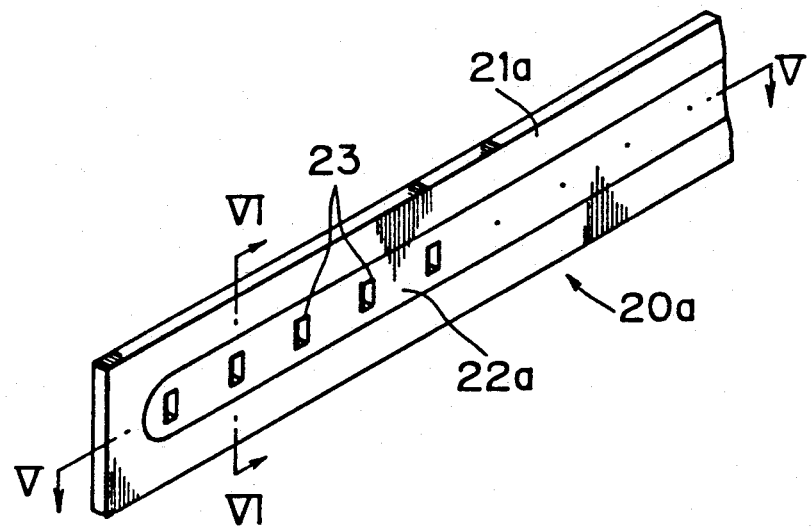
FIG. 4 is a perspective view showing the appearance of an electronic component chip holder 20a according to another embodiment of the present invention.
Figure 10:
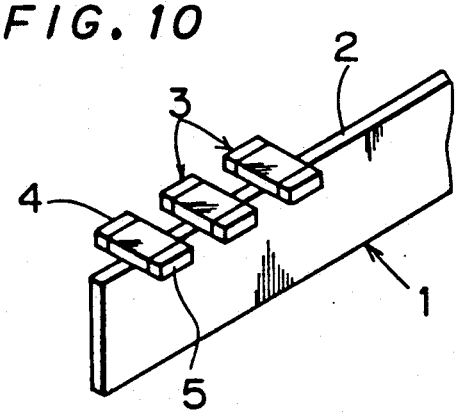
FIG. 10 is a perspective view showing a first example of an electronic component chip holder forming background art of the present invention.
Figure 11:
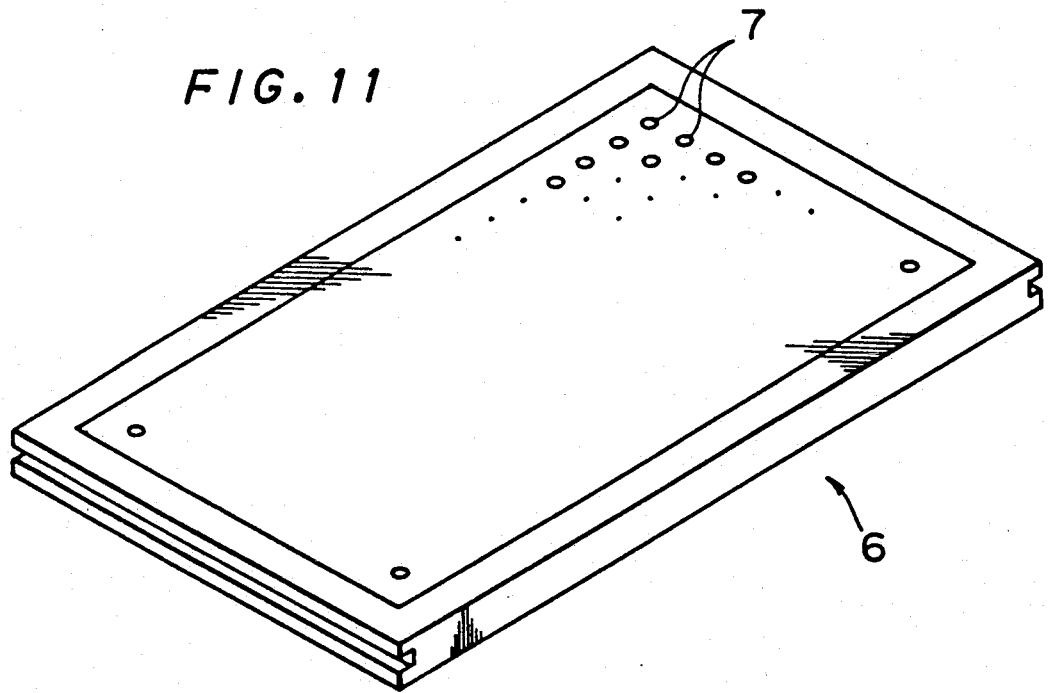
FIG. 11 is a perspective view showing a second example of an electronic component chip holder forming background art of the present invention.
Figure 12:
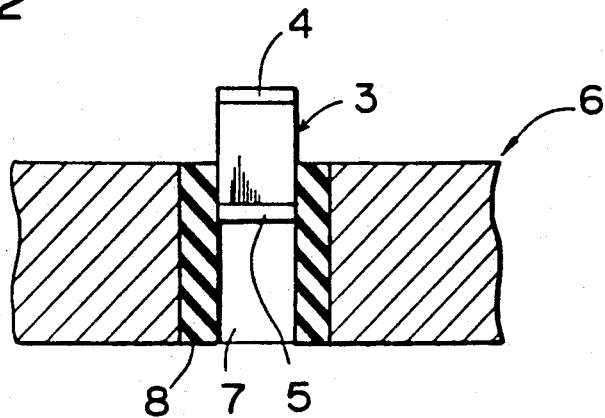
FIG. 12 is an enlarged longitudinal sectional view of one of holding portions 7 of the holder 6 shown in FIG. 11, for illustrating an electronic component chip 3 held in the holding portion 7.
Figure 13:
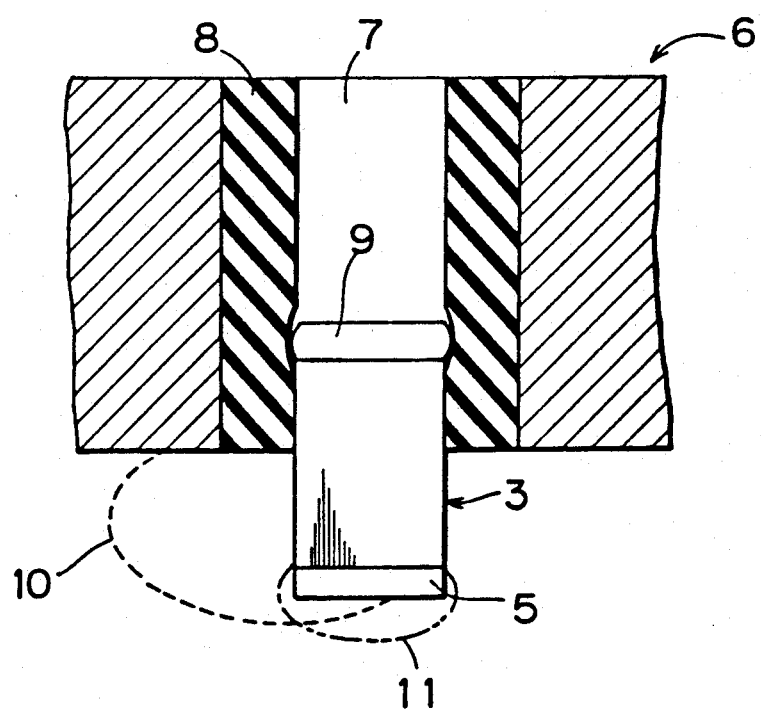
FIG. 13 is an enlarged sectional view showing structure around the holding portion 7, for illustrating disadvantages of the second background art example.

FIG. 4 shows an electronic component chip holder 20a according to another embodiment of the present invention. FIG. 5 is an enlarged sectional view taken along the line V—V in FIG. 4, and FIG. 6 is an enlarged sectional view taken along the line VI—VI in FIG. 4.

According to the embodiment shown in FIGS. 4 to 6, each elastic member 22a is not only provided on an inner peripheral surface defining each holding portion 23, but extends along both surfaces of a holder body 21a. According to this embodiment, mechanical integrity between the holder body 21a and the elastic member 22a can be further improved.

FIG. 7 is an enlarged front elevational view corresponding to FIG. 3, for illustrating still another embodiment of the present invention. Referring to FIG. 7, each elastic member 22b is provided with a plurality of projections 28. Thus, each electronic component chip (not shown) is brought into contact with forward ends of the projections 28, to be held in a holding portion 23. In relation to sectional dimensions of the holding portion 23, a vertical dimension V1 corresponds to the vertical dimension V shown in FIG. 3, and a horizontal dimension H1, which is defined by the space between each pair of opposite projections 28, corresponds to the horizontal dimension H shown in FIG. 3.

FIG. 8 is an enlarged front elevational view corresponding to FIG. 3, for illustrating a further embodiment of the present invention. Referring to FIG. 8, each elastic member 22c is provided with a circular through hole so that each holding portion 23 has a circular sectional configuration of a diameter D. The diameter D of the holding portion 23 is selected to be slightly smaller than the diagonal dimension of a plane defined by the crosswise and perpendicular dimensions W and T of the electronic component chip 24 shown in FIG. 2, for example.

The embodiment shown in FIG. 7 or 8 is significant in showing that a portion of the elastic member to be in contact with the electronic component chip may be in any configuration, as long as the elastic member can elastically hold the electronic component chip in a prescribed position.

The electronic component chip to which the present invention is applied need not restricted to that in the form of a rectangular parallelepiped as shown in FIG. 2, for example. As shown in FIG. 9, a cylindrical electronic component chip 24a, for example, is also employable. Such a cylindrical electronic component chip 24a also has longitudinal, crosswise and perpendicular dimensions. The crosswise and perpendicular dimensions, which correspond to the diameter of the cylinder, are equal to each other. Such an electronic component chip 24a is provided with first and second metallized surfaces 25a and 26a on both of the longitudinal ends thereof.

Although the present invention has been described with reference to the embodiments shown in the drawings, other modifications are also possible within the scope of the present invention.

For example, the holding portions 23 of the electronic component chip holder 20 are not necessarily provided in a row as shown in FIG. 1, but may be arranged in a multi-row manner.

Further, the holder 20 may be provided in the form of an endless strap, which is circulated to continuously carry out steps of inserting electronic component chips into holding portions, dipping the electronic component chips in a molten bath of a metal, raising up the same from the molten bath and extracting the electronic component chips from the holding portions in sequence.

Although the present invention has been described and illustrated in detail, it is clearly understood that the same is by way of illustration and example only and is not to be taken by way of limitation; the scope of the present invention being limited only by the terms of the appended claims.

What is claimed is:

1. A method of performing metal coating on first and second metallized surfaces of a plurality of electronic component chips each having dimensions along longitudinal, crosswise and perpendicular dimensions that are orthogonal to each other and that are provided with said first and second metallized surfaces on both ends along said longitudinal direction, said method comprising the steps of:

preparing an electronic component chip holder having a perpendicular dimension selected to be smaller than said longitudinal dimension of said electronic component chips and comprising a plurality of holding portions defined by through holes passing through the chip holder in said perpendicular direction and having sectional dimensions capable of receiving said crosswise and perpendicular dimensions of said electronic component chips for receiving respective ones of said plurality of electronic component chips one by one along said longitudinal direction of said chips, while being provided with an elastic member on at least a pair of opposite portions of an inner peripheral surface of said holding portions for elastically holding a longitudinal intermediate portion of each of said electronic component chips;

inserting respective ones of said plurality of electronic component chips into respective said holding portions along said longitudinal direction of said chips while elastically holding the same in said chip holder by said elastic members, whereby said plurality of electronic component chips are held by said electronic component chip holder while exposing both said first and second metallized surfaces of said respective ones of said electronic component chips;

preparing a molten bath of a metal to be used in said metal coating;

dipping said plurality of electronic component chips in said molten bath of said metal while holding the same in a single dipping step, by directing said electronic component chip holder into the liquid surface of the molten metal bath so as to bring both of said first and second metallized surfaces into contact with said molten bath simultaneously; and raising up said plurality of electronic component chips from said molten bath while holding the same by said electronic component chip holder so as to allow solidification of parts of said metal adhered onto said first and second metallized surfaces.

2. A method in accordance with claim 1, comprising the step of selecting said perpendicular dimension of said holder to be sufficiently smaller than said longitudinal dimension of said electronic component chips so as to allow each longitudinal end of the component chips to project away from said holder.

3. A method in accordance with claim 2, comprising the step of making portions of said holder except for said elastic members of a metal which is inferior in solderability as compared with the metallized surfaces on the longitudinal ends of said electronic component chips.

4. A method in accordance with claim 3, wherein said metal of said holder is stainless steel.

5. A method in accordance with claim 2, wherein said elastic members are formed of a heat-resistant resin material having elasticity.

6. A method in accordance with claim 5, wherein said metal of said molten bath is selected to have a melting point relatively lower than a temperature at which said elastic member can be damaged.

7. A method in accordance with claim 5, wherein said resin material is selected from the group consisting of silicone rubber, epoxy resin and fluoro rubber.

8. A method in accordance with claim 7, comprising the step of selecting said metal of said molten bath of solder, lead and tin.

9. A method in accordance with claim 2, comprising the step of constructing said elastic members to elastically hold an intermediate, ceramic portion of each of the electronic component chips.

10. A method in accordance with claim 2, comprising the step of forming said elastic members to extend along both of the pair of opposite surface portions of said holder.

11. A method in accordance with claim 2, comprising the steps of providing each of said elastic members with a plurality of projections, and bringing said projections into contact with said electronic component chips.

12. A method in accordance with claim 2, comprising the step of preparing said holder in the form of an elongated strap.

13. A method in accordance with claim 12, wherein said strap is endless and said steps of inserting, dipping, and raising up said chips are repeated continuously.

14. A method in accordance with claim 1, wherein said first and second metallized surfaces are brought into contact with said molten bath substantially simultaneously.

15. A method in accordance with claim 14, wherein substantially no air is trapped between the molten bath and the chip holder.

16. A method in accordance with claim 15, wherein the chips are oriented in the chip holder so as to minimize downwardly-directed areas of the metallized surfaces when the chips are dipped in the molten bath, thereby minimizing formation of drops of molten metal on the metallized surfaces.

* * * * *